United States Patent [19]

Matonak et al.

[11] 3,793,592

[45] Feb. 19, 1974

[54] PHASE SENSITIVE DEMODULATOR

[75] Inventors: Lawrence A. Matonak, Canoga Park, Calif.; Richard A. Huber, Tuscon, Ariz.

[73] Assignee: The United States of America as represented by the Secretary of the Navy, Washington, D.C.

[22] Filed: July 20, 1972

[21] Appl. No.: 273,556

[52] U.S. Cl. .................... 329/50, 307/232, 307/318, 328/134, 329/166, 329/192, 330/9

[51] Int. Cl. .......................... H03d 3/18, H03d 1/00

[58] Field of Search .......... 329/50, 166, 192; 330/9; 332/43 B, 47; 307/318, 262, 321, 232; 328/134

[56] References Cited

UNITED STATES PATENTS

| | | | |
|---|---|---|---|
| 3,241,078 | 3/1966 | Jones | 329/50 |
| 3,243,707 | 3/1966 | Cottrell | 329/50 |
| 3,617,910 | 11/1971 | Struger | 329/166 |
| 3,288,923 | 11/1966 | Arimura et al. | 307/232 X |
| 3,417,338 | 12/1968 | Anderson | 332/47 X |
| 3,436,672 | 4/1969 | Delagrange | 307/318 X |
| 3,153,152 | 10/1964 | Hoffman | 330/9 X |
| 3,514,720 | 5/1970 | Roucache et al. | 332/43 B |
| 3,205,457 | 9/1965 | Bell | 329/50 X |

*Primary Examiner*—Alfred L. Brody
*Attorney, Agent, or Firm*—R. S. Sciascia; P. Schneider

[57] ABSTRACT

A phase sensitive demodulator achieves signal isolation without the use of a transformer or other frequency sensitive component. A diode bridge which shunts the input signal is driven by the outputs of operational amplifiers. Signals which are not shunted are applied to the inputs of another operational amplifier.

5 Claims, 1 Drawing Figure

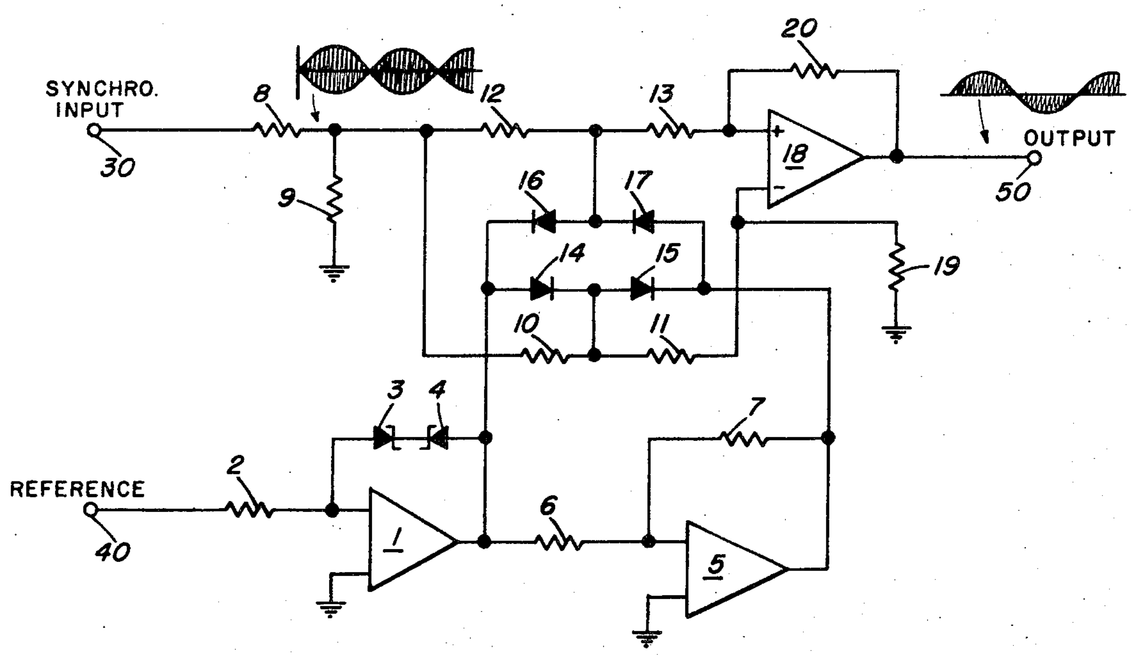
SYNCHRO. INPUT
30
8
9
12
13
20
18
OUTPUT
50
16
17
14
15
19
10
11
3
4
7
REFERENCE
40
2
1
6
5

PHASE SENSITIVE DEMODULATOR

BACKGROUND OF THE INVENTION

The present invention relates generally to phase sensitive demodulators and more particularly to lightweight, solid state phase sensitive demodulators which do not utilize transformers.

Prior to the development of diode phase demodulators, electron tube demodulators were used. Because of the necessity of providing floating control grid voltages transformers had to be used to provide isolation. This limited the frequency range in which the demodulator could be used. The equipment was large and bulky due to the size of the electron tubes and the transformers.

The development of semiconductor diode phase demodulators has been part of the general trend in the electronics industry towards miniaturization and micro-miniaturization. As the circuits get smaller, the transformer becomes the limiting factor as to the size of the equipment package as well as the frequency performance of the circuit. In response to this problem various circuits have been designed to eliminate the necessity for having a transformer to provide isolation between the input signal and the output signal. These prior art circuits have been either inefficient or complicated and expensive.

SUMMARY OF THE INVENTION

The present invention provides a transformerless semiconductor diode phase sensitive demodulator that is both efficient and simple. The usual method of achieving phase sensitive demodulation involves utilizing balanced diodes in a bridge configuration which must be driven by a transformer because this type of demodulator requires that the reference signal be electrically isolated from the signal to be demodulated. In the present invention balanced drive to the diodes is achieved by drive from operational amplifiers. Electrical isolation is not required due to the small signal present at the summing junctions of the operational amplifiers. The operational amplifiers are controlled by the reference signal. The diode bridge is effectively connected to shunt portions of the synchro input signal when certain diodes in the bridge are conducting. The unshunted part of the synchro input signal is applied to an output operational amplifier.

The use of solid state components instead of transformers results in a circuit which is small and light weight as well as capable of operating over a wide range of frequencies without component changes. This is particularly advantageous in airborne and missile applications.

The invention is especially useful in AC servo systems to demodulate synchro information, either for the purpose of dynamic compensation or quadrature rejection.

OBJECTS OF THE INVENTION

An object of the present invention is to provide a transformerless phase sensitive demodulator.

Another object of the invention is to provide a small, lightweight phase sensitive demodulator operable over a wide range of frequencies.

A further object of the invention is to provide a balanced diode bridge phase sensitive demodulator in which the diodes are driven by operational amplifiers.

Other objects, advantages and novel features of the present invention will become apparent from the following detailed description of the invention when considered in conjunction with the accompanying drawing.

BRIEF DESCRIPTION OF THE DRAWING

The FIGURE shows the preferred embodiment of the invention in schematic diagram form.

DETAILED DESCRIPTION OF THE PREFERRED EMBODIMENT

Referring to the drawing, it can be seen that there are two alternating current input terminals 30 and 40. Terminal 30 receives the synchro input signal which is to be demodulated. The synchro input signal will be a sine wave envelop modulated carrier signal with the phase of the carrier signal reversing each time the envelop passes through zero. When used in an aircraft system the carrier singal frequency of the synchro signal will normally be 400 HZ. Terminal 40 receives an AC reference signal, usually sinusoidal, of the same frequency as the synchro carrier signal. After passing through resistor 8 and being developed on load resistor 9, the synchro signal is connected to the non-inverting input terminal of operational amplifier 18 through resistors 12 and 13, and to the inverting input terminal of operational amplifier 18 through resistors 10 and 11. The inverting terminal of amplifier 18 is connected to ground via resistor 19. Output terminal 50 is connected back to the non-inverting input terminal of 18 by feedback resistor 20. Diodes 14, 15, 16 and 17 are connected together to form a bridge circuit. The junction of diodes 16 and 17 is connected to the junction of resistors 12 and 13, and the junction of diodes 14 and 15 is connected to the junction of resistors 10 and 11.

Reference signal terminal 40 is connected via resistor 2 to the input terminal of a comparator type high gain DC operational amplifier 1. Back-to-back zener diodes 3 and 4 connect the output of amplifier 1 back to its input. The output of amplifier 1 is connected to the junction of diodes 14 and 16 and, via resistor 6 to the input terminal of high gain DC operational amplifier 5. The output of amplifier 5 is connected to the junction of diodes 15 and 17 and back to its input terminal by resistor 7.

Operation of the circuit will now be described. The synchro input terminal 30 receives an sine wave envelop modulated carrier signal with the phase of the carrier signal reversing each time the envelop passes through zero. Reference input terminal 40 receives a sinusoidal alternating current reference signal of the same frequency as the carrier signal and either in phase with or 180° out of phase with the carrier signal. Operational amplifier 1, in conjunction with resistor 2 and zener diodes 3 and 4 in the feedback loop, provides a square wave at its output terminal. Each time the reference sine wave passes through zero the polarity of the output of operational amplifier 1 changes. Therefore the square wave is of the same frequency as, and in phase with, the reference sine wave. The square wave is applied to the inverting input of operational amplifier 5 which provides at its output a square wave identical to the output of operational amplifier 1 but inverted in polarity. The square wave from amplifier 1 is applied to the diode bridge at the junction of diodes 14 and 16 at the same time that the inverted square wave is being applied to the bridge at the junction of diodes 15 and 17. The synchro input waveform is also being applied to the diode bridge at the junction of diodes 16 and 17, via resistor 12, and at the junction of diodes 14 and 15 via resistor 10. When the output of amplifier 1 is positive and the output of amplifier 5 is negative, diodes 14 and 15 are forward biased and conducting while diodes 16 and 17 are reverse biased. This result in the synchro signal on resistor 10 being shunted through the diodes and effectively prevented from reaching the inverting input terminal of operational amplifier 18 while the synchro signal on resistor 12 is being applied to the non-inverting input of operational amplifier 18. The operational amplifier then amplifies only the positive portion of the applied synchro signal, if the sinusoidal alternating current reference signal is in phase with the carrier signal. If the reference sine wave signal is 180° out of phase with the carrier signal the negative portion of the applied synchro input signal is amplified.

When the output of operational amplifier 1 is negative and the output of operational amplifier 5 is positive, diodes 16 and 17 are forward biased and conducting while diodes 14 and 15 are reverse biased. This results in the synchro signal being applied to the inverting input of operational amplifier 18 while the synchro signal on resistor 12 is shunted by the diodes and prevented from reaching the non-inverting input of operational amplifier 18. Amplifier 18 then amplifies and inverts only the negative portion of the synchro signal if the reference sine wave signal is in phase with the carrier signal. If the reference sine wave signal is 180° out of phase with the carrier signal the positive portion of the applied synchro input signal is amplified and inverted.

The invention can also be used for phase sensitive detection of an unmodulated sine wave of the same frequency as the reference signal. If the unmodulated sine wave is in phase with the reference signal, a positive rectified sine wave will be passed through operational amplifier 18 to ouutput terminal 50 while if the sine wave is out of phase with the reference signal, there will be a negative output on terminal 50. This is so because when the signals are in phase diodes 16 and 17 will be reversed biased when they are positive, allowing non-inverting half of the input signal to reach the positive input of 18, and diodes 14 and 15 will be reversed biased when they are both negative, allowing the negative half of the input signal to reach the inverting input of 18. In contrast, when the signals are out of phase, diodes 14 and 15 will be reversed biased during the positive half of the input signal so that the positive half of the signal is prevented from reaching the non-inverting input of 18 but reaches the negative input where it has a negative effect. During the negative half of the input signal diodes 16 and 17 will be reversed biased permitting the negative half of the signal to reach the non-inverting input of 18 but not the inverting input.

Obviously, many modifications and variations of the present invention are possible in light of the above teachings. It is therefore to be understood that, within the scope of the appended claims, the invention may be practiced otherwise than as specifically described.

What is claimed is:

1. A phase-sensitive demodulator comprising:

a diode bridge having first, second, third, and fourth control junctions, said first and second control junctions being diametrically opposite each other and said third and fourth control junctions being diametrically opposite each other;

means for receiving an input AC waveform and connecting it across said first and second control junctions of said diode bridge;

an amplifier having a first input connected to said first control junction of said diode bridge, and a second input connected to said second control junction of said diode bridge, and an output which supplies a demodulated signal;

a reference AC waveform generating means providing first and second outputs of opposite phase, but of identical frequency to each other and to said input AC waveform, a connection from said first output to said third control junction of said diode bridge, a connection from said second output to said fourth control junction of said diode bridge whereby said input AC waveform is gated either to said first or to said second input of said amplifier determined by said reference AC waveform generating means.

2. The demodulator of claim 1 wherein said reference AC waveform generating means comprises:

means for receiving a sinusoidal reference signal having an identical frequency to said input AC waveform and for providing a first squarewave to said first output and a second squarewave to said second output.

3. The demodulator of claim 2 wherein:

said means for providing said first squarewave and said second squarewave comprises a pair of operational amplifiers.

4. The demodulator of claim 3 wherein said pair of operational amplifiers consists of:

a second operational amplifier having an output; and said second operational amplifier having back-to-back zener diodes in a feedback path whereby said first squarewave appears at said output of said second operational amplifier; and a third operational amplifier having an output; and said third operational amplifier having an inverting input connected to said output of said second operational amplifier whereby said second squarewave appears at said output of said third operational amplifier.

5. The demodulator of claim 4 wherein:

said AC input waveform and said AC reference waveform are 400 HZ in frequency.

* * * * *